United States Patent
Chiu et al.

(10) Patent No.: US 9,471,104 B2
(45) Date of Patent: Oct. 18, 2016

(54) READER APPARATUS

(71) Applicant: Chant Sincere Co., Ltd., New Taipei (TW)

(72) Inventors: Wen-Ta Chiu, New Taipei (TW); Huagu Zi, New Taipei (TW); Wen-Shuan Shih, New Taipei (TW)

(73) Assignee: CHANT SINCERE CO., LTD., New Taipei (TW)

( * ) Notice: Subject to any disclaimer, the term of this patent is extended or adjusted under 35 U.S.C. 154(b) by 60 days.

(21) Appl. No.: 14/625,028

(22) Filed: Feb. 18, 2015

(65) Prior Publication Data
US 2015/0277493 A1 Oct. 1, 2015

(30) Foreign Application Priority Data

Mar. 26, 2014 (TW) .............................. 103205164 U

(51) Int. Cl.
| | | |
|---|---|---|
| G06F 1/16 | (2006.01) | |
| H05K 1/11 | (2006.01) | |
| H05K 7/14 | (2006.01) | |
| H05K 5/02 | (2006.01) | |

(52) U.S. Cl.
CPC ............. *G06F 1/1632* (2013.01); *H05K 1/111* (2013.01); *H05K 5/0278* (2013.01); *H05K 7/1427* (2013.01)

(58) Field of Classification Search
CPC ... H05K 1/111; H01R 12/7005; H01R 13/62
USPC ............. 345/174, 659, 82; 165/104.11, 80.4; 361/679.23, 679.02, 679.52, 679.58, 361/679.4, 679.46, 679.54, 679.41, 679.32, 361/679.26; 439/607.1, 495, 151, 529, 439/607.23, 626, 607.19, 669; 174/260, 174/254, 263, 267, 74 R, 255, 257
See application file for complete search history.

(56) References Cited

U.S. PATENT DOCUMENTS

| | | | | |
|---|---|---|---|---|
| 2008/0166899 | A1* | 7/2008 | Lang ................... | H01R 12/7005 439/64 |
| 2011/0159719 | A1* | 6/2011 | Takahashi .............. | H01R 12/79 439/329 |
| 2013/0335933 | A1* | 12/2013 | Ishii ....................... | H05K 1/111 361/752 |

* cited by examiner

*Primary Examiner* — Hung Duong
(74) *Attorney, Agent, or Firm* — Bacon & Thomas, PLLC

(57) ABSTRACT

A reader apparatus, comprising: a circuit board, including a plurality of lower touching pads, located on a lower surface of the circuit board; an insulative body, including a front supporting element and a rear supporting element extending from the front supporting element, wherein a plurality of planar conductive terminals disposed on an upper surface of the front supporting element, the rear supporting element located under the circuit board, the plural planar conductive terminals extends backward and sandwiched between a lower surface of the circuit board and a upper surface of the rear supporting element, and the planar conducting terminals sandwiched between the lower surface of the circuit board and the upper surface of the rear supporting element electrically connects to a plurality of a lower touching pads; and a casing surrounding the circuit board and the insulative body.

13 Claims, 3 Drawing Sheets

READER APPARATUS

CROSS-REFERENCE TO RELATED APPLICATIONS

This application claims the benefit of the filing date under 35 U.S.C. §119(a)-(d) of Taiwan Patent Applications No. 103205164, filed Mar. 26, 2014.

BACKGROUND OF THE INVENTION

1. Field of the Invention

The present invention relates to a reader apparatus, and particularly to a USB reader with specific structure.

2. Description of the Related Art

Nowadays, with the smaller the electronic devices, a USB reader also becomes lighter, thinner, shorter and smaller. A USB reader is used for signal transmission among electronic products or among elements in an electronic product, wherein a USB specification, i.e., a Universal Serial Bus specification, is applied not only for data transmission, but also for electricity charging, which is widely applied in various electronic products, cars, and industrial instruments.

Prior USB reader comprises a circuit board, a plurality of conductive terminals and an insulating body, wherein the USB conductive terminals are disposed on the isolation body, bending downward and extending toward the circuit board, then vertically bending and contacting the upper surface of the circuit board, and soldered on the touching pad on the surface of the circuit board by Surface Mount Technology (SMT).

However, in prior art, the conductive terminals are only welded to fix on the circuit board, which is thus easy to be loosen to cause poor contact or circuit damage after a long-term use. In addition, the insulating body is disposed on the circuit board, which makes the prior USB reader fairly thick. Therefore, to solve aforementioned problems has become an issue.

SUMMARY OF THE INVENTION

The primary object of the present invention is to provide a thinner reader apparatus with more durable conductive terminals and with a thin shape.

To solve the prior technical problem, the present invention provides a reader apparatus, comprising: a circuit board, including a plurality of lower touching pads, located on a lower surface of the circuit board; an insulative body, including a front supporting element and a rear supporting element extending from the front supporting element, wherein a plurality of planar conductive terminals disposed on an upper surface of the front supporting element, the rear supporting element located under the circuit board, the plural planar conductive terminals extends backward and sandwiched between a lower surface of the circuit board and a upper surface of the rear supporting element, and the planar conducting terminals sandwiched between the lower surface of the circuit board and the upper surface of the rear supporting element electrically connects to a plurality of a lower touching pads; and a casing surrounding the circuit board and the insulative body.

According to one aspect of the present invention, the circuit board comprises two engaging concave edges, both of which are located on two side edges of the circuit board, and the rear supporting element including two engaging parts which engages to the two engaging concave edges.

According to one aspect of the present invention, the circuit board comprises two slots, which are located on the lower surface of the circuit board, wherein two protruding parts locates on the upper surface of the rear supporting element, and are sleeved on the slot.

According to one aspect of the present invention, the reader apparatus further comprises a plurality of flexible arm-type conductive terminals, wherein each flexible arm-type conductive terminal includes a fixing part which is fixed on the circuit board, a flexible touching part which extends from the front side of the fixing part, and a connecting part which extends from the rear side of the fixing part, and the connecting part is electrically connected to the plurality of upper touching pads of the circuit board.

According to one aspect of the present invention, a plurality of USB planar conductive terminals has adapted to different specifications with that of the flexible arm-type conductive terminals.

According to one aspect of the present invention, the reader apparatus further comprises a shaping block which is allocated on the circuit board, and the fixing part is fixed on the circuit board by the shaping block.

According to one aspect of the present invention, the front supporting element comprises a plurality of receiving holes located under the flexible touching part.

According to one aspect of the present invention, the receiving holes penetrate through the front supporting element.

According to one aspect of the present invention, the receiving holes are concaved and located on the upper surface of the front supporting element.

According to one aspect of the present invention, the rear supporting element comprises a plurality of flexible terminals for memory cards, which connect to a plurality of lower touching pads and extend backward from the lower touching pads to form a plurality of flexible blocking parts, wherein a receiving space for memory card is formed under the insulative body.

According to one aspect of the present invention, the reader apparatus further comprises a card ejecting unit, which includes an ejecting part, a connecting part and a pushing part, wherein the connecting part connects the ejecting part and the pushing part vertically, and the ejecting part corresponds to the receiving space for memory cards.

According to one aspect of the present invention, the reader apparatus further comprises a shielding casing, which is allocated to surround the USB planar conductive terminals.

According to one aspect of the present invention, the shielding casing comprises an engaging part, and the casing comprises a concaved groove in which the engaging part is located.

According to one aspect of the present invention, the reader apparatus has the following effects. By sandwiching the planar conductive terminals between the upper surface of the rear supporting element of the insulative body and the lower surface of the circuit board, the planar conductive terminals are better retained, which enhance the reader apparatus of the present invention more durable. In addition, the planar conductive terminals extend backward to be sandwiched between the lower surface of the circuit board and an upper surface of the rear supporting element, such that the planar conductive terminals are at the same planar height as the circuit board, therefore reducing the thickness of the reader apparatus of the present invention.

DETAILED DESCRIPTION OF THE EMBODIMENT(S)

Embodiments are described in detail below with reference to FIGS. 1 to 3, and the description is used for explaining the embodiments of the present invention only, and is not intended to limit the described embodiments of the present invention.

Figure 1:
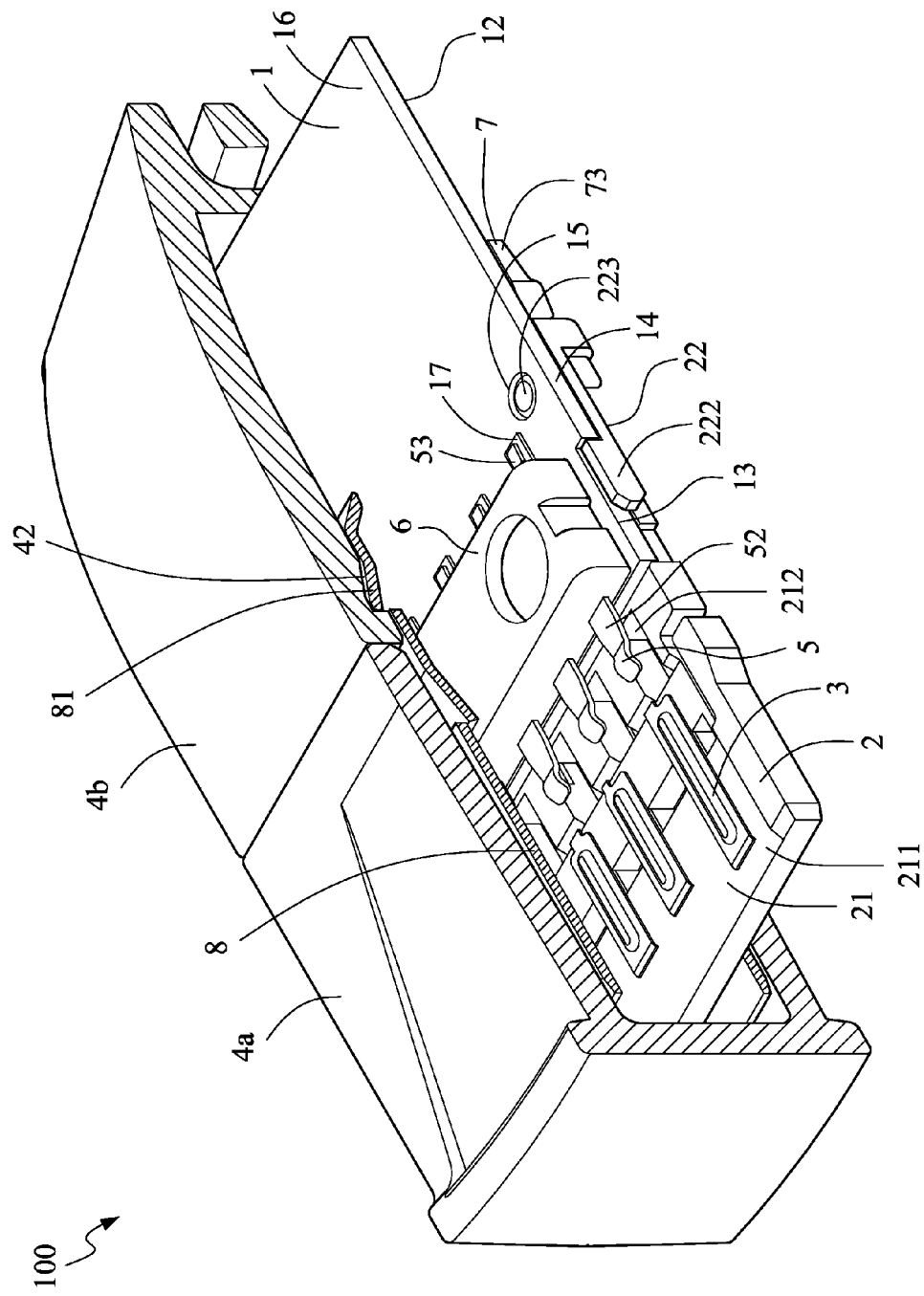
FIG. 1 is a partial cross-sectional view according to one embodiment of the present invention.
Figure 2:
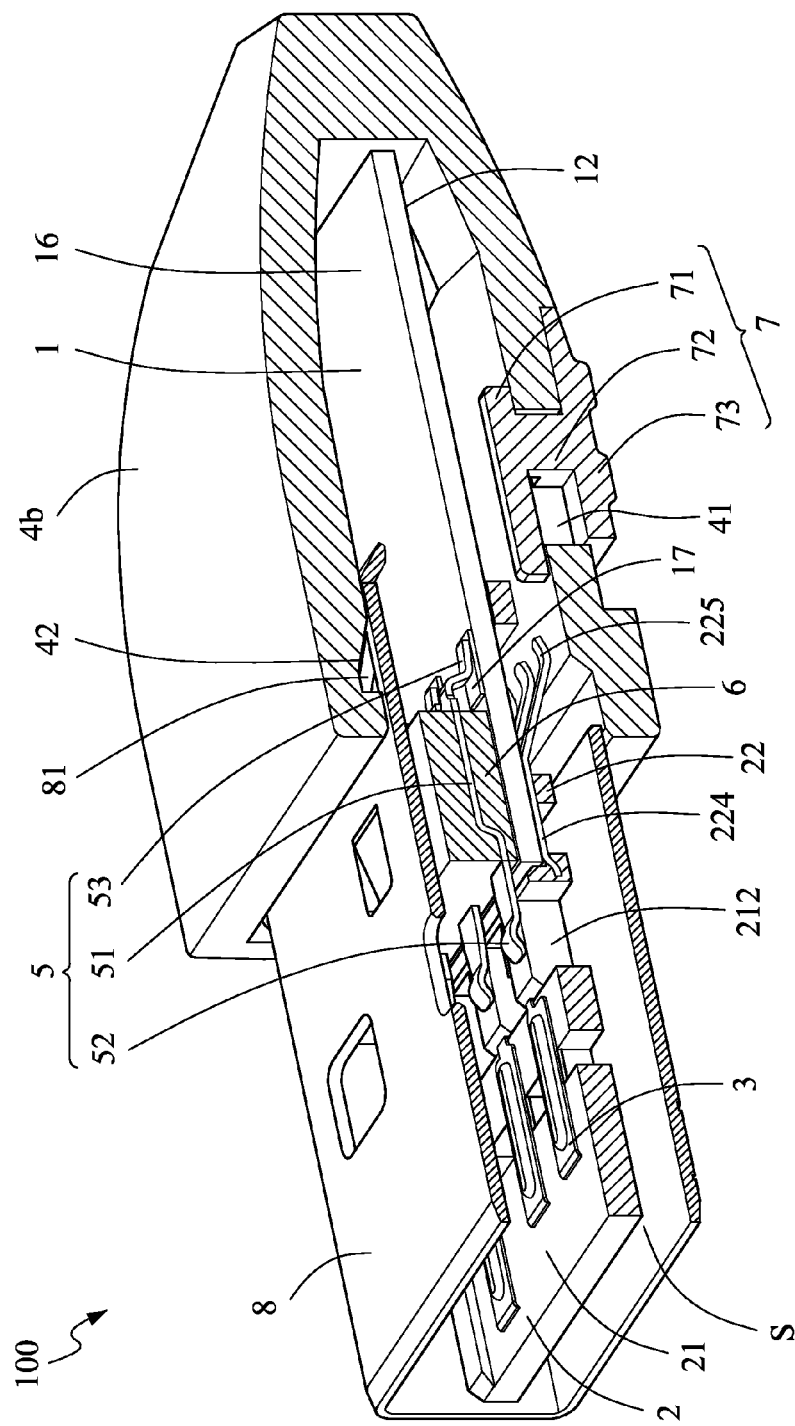
FIG. 2 is a cross-sectional view according to one embodiment of the present invention.
Figure 3:
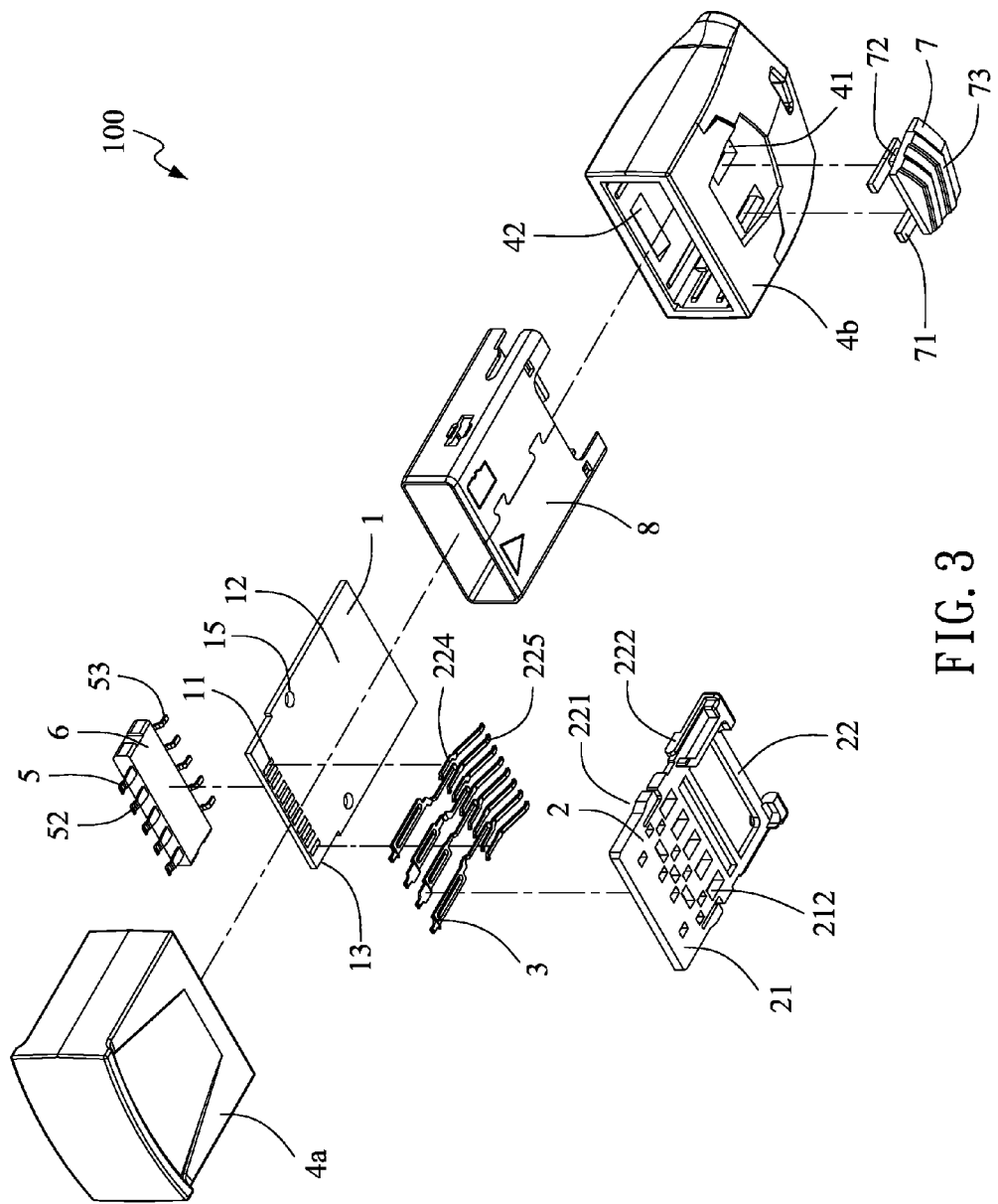
FIG. 3 is an exploded view according to one embodiment of the present invention.

As shown in FIGS. 1 to 3, the embodiment of the present invention provides a reader apparatus comprising: a circuit board 1, an insulative body 2, a plurality of planar conductive terminals 3, and a casing 4a, 4b. The casing 4a is configured to a removable cover.

The circuit board 1 comprises a plurality of lower touching pads 11, which are located at a lower surface of the circuit board 1. The insulative body 2 comprises a front supporting element 21, and a rear supporting element 22, which is extended from the front the structure support unit 21. A plurality of planar conductive terminals 3 is disposed on the upper surface 211 of the front supporting element 21. The rear supporting element 22 is located under the circuit board 1. A plurality of planar conductive terminals 3 extend backward in such manner that they are sandwiched between the lower surface of the circuit board 1 and an upper surface 221 of the rear supporting element 22. A plurality of planar conductive terminals 3 which are sandwiched between the lower surface of the circuit board 1 and an upper surface 221 of the rear supporting element 22 are electrically connected to the lower touching pads 11. The casing 4b surrounds the circuit board 1 and the insulative body 2.

The circuit board 1 and the insulative body 2 can be fixed by any different ways. For example, as shown in FIGS. 2 and 3, the circuit board 1 comprises two engaging concave edges 13, which are located on two side edges 14 of the circuit board 1, and the rear supporting element 22 comprises two engaging parts 222 which are engaged with the engaging concave edges 13. Alternatively, the circuit board 1 comprises two slots 15, which are located on the lower surface 12 of the circuit board 1. The two protruding parts 223 are located on the upper surface 221 of the rear supporting element 22, in which the two protruding parts 223 sleeve within the slots 15. Of course, the above is not for limiting the present invention, in which the slots 15 can alternatively be concaved grooves. The insulative body 2 can be fixed to the circuit board 1 by retaining the two engaging parts 222 and the two protruding parts 223 to the engaging concave edges 13 and the slots 15.

As shown in FIGS. 1 and 2, the reader apparatus 100 further comprises a plurality of flexible arm-type conductive terminals 5 and a shaping block 6. Each of the flexible arm-type conductive terminals 5 includes a fixing part 51 which is fixed on the circuit board 1, a flexible touching part 52 which is extended from the front side of the fixing part 51, and a connecting part 53 which is extended from the rear side of the fixing part 51. The shaping block 6 is located on the upper surface 16 of the circuit board 1, and the fixing part 51 is located on the shaping block 6 by which the fixing part 51 is fixes on the circuit board 1. A plurality of the upper touching pads 17 is located on the upper surface 16. The flexible arm-type conductive terminals 5 are electrically connected to the upper touching pads 17 by the connecting part 53.

Preferably, the planar conductive terminals follow a specification for USB 2.0 type pins, and the flexible arm-type conductive terminals follow a specification for USB 3.0 type pins. Of course, the present invention is not to limit this. The planar conductive terminals can also follow a specification of USB 3.0 type pins, and the flexible arm-type conductive terminals can also follow the specification of USB 2.0 type pins.

As shown in FIGS. 1 to 3, the front supporting element 21 comprises a plurality of receiving holes 212, which is located under the flexible touching part 52 of the flexible arm-type conductive terminals 5. The receiving holes 212 are for receiving the flexible touching part 52 when a USB device electrically connects to the flexible touching part 52 to bent the flexible touching part 52 downward, thereby the receiving holes 212 preventing the front supporting element 21 from being scratched and preventing the flexible touching part 52 from being damaged while the flexible touching part 52 contact against the front supporting element 21. In this embodiment, the receiving holes 212 are through holes that penetrate through the front supporting element 21. Of course, the present invention is not limited to this. The receiving holes 212 could also be a concaved slot located on the upper surface 221 of the front supporting element 21.

As shown in FIGS. 2 and 3, the rear supporting element 22 comprises a plurality of flexible terminals 224 for the memory cards, which are connected to the lower touching pads 11, and is further extended backward from the lower touching pads 11 to form a plurality of flexible blocking parts 225. A receiving space S for memory card is formed under the insulative body. In this embodiment, the flexible terminals 224 follows the Micro SD memory card specifications, and the receiving space S is compatible to the Micro SD memory card. Preferably, the reader apparatus 100 comprises a card ejecting unit 7. The card ejecting unit 7 comprises an ejecting part 71, a connecting part 72 and a pushing part 73. The connecting part 72 is located on the casing 4b in a manner that the connecting part 72 is able to slide back and forth in relation to the casing 4b. The ejecting part 71 connects to the connecting part 72 and is protruded within the receiving space S. The pushing part 73 connects to the connecting part 72 and is exposed outside the casing 4b. The ejecting part 71 is driven by the connecting part 72 and the pushing part 73 to push the memory card out of the receiving space S. The casing 4b comprises a through hole 41, and the connecting part 72 is located in the through hole 41, and is capable of sliding through the through hole 41. When the pushing part 73 is pushed forward, the ejecting part 71 correspondingly pushes out the memory card inside the receiving space S to thus push the memory card out of the reader apparatus 100.

Preferably, the reader apparatus 100 further comprises; a shielding casing 8, which is allocated to surround the planar conductive terminals 3; flexible arm-type conductive terminals 5; and flexible terminals 224, thereby providing electromagnetic shielding effect with respect to the reader apparatus 100 to solve the bad signal transmission problem.

As shown in FIG. 2, the embodiment of the present invention provides a reader apparatus, in which the shielding casing 8 comprises a engaging part 81. The casing 4b comprises a concaved groove 42 to which the engaging part 81 is engaged.

While the invention has been described in terms of various specific embodiments, those skilled in the art will recognize that the invention can be practiced with modification within the spirit and scope of the claims.

What is claimed is:

1. A reader apparatus, comprising:
   a circuit board, including a plurality of lower touching pads, located on a lower surface of said circuit board;
   an insulative body, including a front supporting element and a rear supporting element extending from said front supporting element, wherein a plurality of planar conductive terminals disposed on an upper surface of said front supporting element, said rear supporting element located under said circuit board, said planar conductive terminals extended backward and sandwiched between said lower surface of said circuit board and a upper surface of said rear supporting element, and said plurality of planar conducting terminals sandwiched between said lower surface of said circuit board and said upper surface of said rear supporting element, electrically connected to a plurality of a lower touching pads; and
   a casing surrounding said circuit board and said insulative body.

2. The reader apparatus of claim 1, wherein said circuit board comprises two engaging concave edges, both of which are located on two side edges of said circuit board, and said rear supporting element includes two engaging parts engaged to said engaging concave edges.

3. The reader apparatus of claim 1, wherein said circuit board comprises two slots located on said lower surface of said circuit board, wherein two protruding parts locate on said upper surface of said rear supporting element, and are sleeved on said slots.

4. The reader apparatus of claim 1, wherein said reader apparatus further comprises a plurality of flexible arm-type conductive terminals, wherein each flexible arm-type conductive terminal includes a fixing part fixed on said circuit board, a flexible touching part extended from the front side of said fixing part, and a connecting part extended from the rear side of said fixing part, said connecting part electrically connected to said plurality of upper touching pads of said circuit board.

5. The reader apparatus of claim 4, wherein said plurality of planar conductive terminals have adapted to different specifications with said flexible arm-type conductive terminals.

6. The reader apparatus of claim 4, wherein said reader apparatus further comprises a shaping block allocated on said circuit board, and said fixing part is fixed to said circuit board by said shaping block.

7. The reader apparatus of claim 4, wherein said front supporting element comprises a plurality of receiving holes located under said flexible touching part.

8. The reader apparatus of claim 7, wherein said receiving holes penetrate through said front supporting element.

9. The reader apparatus of claim 7, wherein said receiving holes are concaved and located on said upper surface of said front supporting element.

10. The reader apparatus of claim 1, wherein said rear supporting element comprises a plurality of flexible terminals for memory cards, which connect to said plurality of lower touching pads and extend backward from said lower touching pads to form a plurality of flexible blocking parts, wherein a receiving space for memory card S is formed under said insulative body.

11. The reader apparatus of claim 10, wherein said reader apparatus further comprises a card ejecting unit, which includes an ejecting part, a connecting part and a pushing part, wherein said connecting part connects said ejecting part and said pushing part vertically, and said ejecting part corresponds to said receiving space for memory cards.

12. The reader apparatus of claim 1, wherein said reader apparatus further comprises a shielding casing, which is allocated to surround said planar conductive terminals.

13. The reader apparatus of claim 12, wherein said shielding casing comprises an engaging part, and said casing comprises a concaved groove in which said engaging part is located.

* * * * *